US006979637B2

(12) United States Patent
Beach et al.

(10) Patent No.: US 6,979,637 B2
(45) Date of Patent: Dec. 27, 2005

(54) METHOD AND STRUCTURE FOR CONTROLLING SURFACE PROPERTIES OF DIELECTRIC LAYERS IN A THIN FILM COMPONENT FOR IMPROVED TRIMMING

(75) Inventors: Eric W. Beach, Tucson, AZ (US); Walter B. Meinel, Tucson, AZ (US); Eric L. Hoyt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 10/653,777

(22) Filed: Sep. 2, 2003

(65) Prior Publication Data

US 2005/0186751 A1     Aug. 25, 2005

Related U.S. Application Data

(62) Division of application No. 10/251,263, filed on Sep. 20, 2002, now Pat. No. 6,818,966.

(51) Int. Cl.$^7$ ................... H01L 21/4763; H01L 21/20

(52) U.S. Cl. ................. 438/622; 438/623; 438/624; 438/625; 438/384; 438/FOR 220; 257/E27.047; 257/E23.15

(58) Field of Search ................. 438/622–625

(56) References Cited

U.S. PATENT DOCUMENTS 6,320,242 B1 * 11/2001 Takasu et al. ............. 257/529

* cited by examiner

*Primary Examiner*—George Fourson
*Assistant Examiner*—Thanh V. Pham
(74) *Attorney, Agent, or Firm*—W. Daniel Swayze, Jr.; W. James Brady; Frederick J. Telecky, Jr.

(57) ABSTRACT

A method and structure for controlling the surface properties in the dielectric layers in a thin film component can be provided for improving the trimming process of thin film element. A metal fill is configured with a uniform fill pattern beneath an array of thin film resistors, and can comprise a plurality of smaller features or peaks providing a finer fill pattern that improves the control of the topology of the dielectric layers. The fill pattern can be configured in various manners, such as fill patterns parallel to the thin film resistor, fill patterns perpendicular to the thin film resistor, or fill patterns comprising a checkerboard-like configuration. The method and device for controlling the dielectric layers can also provide for a reduction in the interferences that can be caused by reflecting back of the focused energy by comprising a dispersion arrangement configured to provide dispersive grading of the laser energy below the thin film resistor and thus reduce the interaction of reflected energy with the incident laser beam. The method also improves the contrast of the laser alignment targets with respect to their background.

11 Claims, 6 Drawing Sheets

METHOD AND STRUCTURE FOR CONTROLLING SURFACE PROPERTIES OF DIELECTRIC LAYERS IN A THIN FILM COMPONENT FOR IMPROVED TRIMMING

This application claims priority under 35 USC § 119(e)(1) of application Ser. No. 10/251,263, filed Sep. 20, 2002 now U.S. Pat. No. 6,818,966. This application is a divisional of the above mentioned application.

FIELD OF INVENTION

The present invention relates to integrated circuits. More particularly, the present invention relates to a method and structure for controlling the surface properties of dielectric layers in a thin film component to improve the laser trimming process.

BACKGROUND OF THE INVENTION

The demand for improved operational amplifiers, as well as instrumentation amplifiers, voltage regulators, references and analog-to-digital (A/D) and digital-to-analog (D/A) converters, for high-precision data acquisition and instrumentation applications continues to increase. The majority of high performance amplifiers, circuits and devices utilize thin film techniques. In thin film techniques, a thin film metal and other dielectrics of a few $\mu$m thick are deposited on a suitable substrate material and formed into the desired pattern for interconnections and components.

Thin film techniques are frequently used for the fabrication of resistors to satisfy miniaturization requirements while providing a very high component density that is desirable in such circuit designs. Thin film resistors can give excellent matching if designed with care, and can have longer term stability and higher reliability. By using a metal film as the resistance material, thin film resistors are able to provide a very low temperature coefficient of resistance (TCR), significantly lower current noise and small non-linearity. Resistor materials used in thin film resistors typically include SiCr, NiCr or TaN, among others.

One of the benefits of using thin film resistors is that the resistors can be trimmed during the manufacturing process, in which the impedance of the integrated circuit can be adjusted to part-per-million type levels. Laser trimming, which uses an optical energy source, is the process most frequently used due to the ability to achieve high accuracy and volume requirements. In order to facilitate laser trimming, the optical energy needs to be focused on the thin film resistor, and more importantly, absorbed in the thin film resistor, as opposed to being reflected back.

For example, as the optical energy is focused on the thin film resistor, different results can occur. While some of the optical energy of the incident beam is absorbed in the thin film resistor to enable trimming of the impedance, some of the optical energy is transmitted through or around the thin film resistor to the substrate, and often reflected back to cause destructive interferences with the incident beam, i.e., the reflected laser energy can be reflected back causing interference with the focused laser energy used for trimming. For example, on many occasions, approximately 40% of the focused laser energy is absorbed in the thin film resistor during trimming, with the remaining laser energy being available for reflecting back to interact with the incident beam, i.e., to align itself in the direction of the incident beam. Such destructive interferences result in less energy being available to perform the trimming process, often resulting in discontinuous trimming of the thin film resistor, or the complete inability to trim.

One approach for addressing such impairments to the laser trimming process is to optimize the dielectric stacks by assessing and controlling the material properties of the dielectrics, e.g., the oxide layers, above and below the thin film resistor that is being trimmed. For example, the dielectrics can be thermally grown as a field oxide or can be deposited oxide on top of the substrate and thin film resistors. With reference to FIG. 1, control of the oxides above the thin film resistor can generally be within a range of approximately +/−1700 Å to enable the focusing of the laser energy to the "sweet spot" for the thin film resistor, e.g., a region 102. However, control of the oxides below the thin film resistor needs to be within approximately +/−600 Å. While the material properties for the dielectrics should ideally be substantially the same with very small variance, the depositing of oxides prior to using chemical-mechanical polishing (CMP) can result in a variance of 2000 Å or more, and thus prevent the focusing of the laser energy to region 102, i.e., to the "sweet spot" for the thin film resistor.

Because of the difficulty in controlling the deposited dielectrics and CMP processes, it can be difficult to obtain at least the approximately 40% to 45% of the focused laser energy that is needed to be absorbed in the thin film resistor during trimming to be effective, with the remaining laser energy being susceptible to reflection back to the incident beam. On some occasions, as little as 20% or 10% of the focused laser energy is absorbed, and thus an insufficient trimming process can occur. One approach to solve this dilemma is to increase the power of the laser energy, e.g., up to approximately 4× or more the laser energy, and/or the trimming time to obtain the equivalent of the 40% absorption rate. Unfortunately, under this approach the energy to the non-absorbed areas is also increased, thus increasing the amount of energy that is reflected back, as well as disrupting the dielectrics and/or other characteristics important to the trimming process. Further, one can exceed the available trim range due to the leakage across the laser kerf due to insufficient energy absorption at the thin film resistor.

To improve surface uniformity of the deposited layers when using chemical-mechanical polishing processes, a metal support, or "dummy fill," is frequently used as an underlying material to provide a desired fill density before depositing the thin film material. If not, severe dishing and other defects can occur, as opposed to a more desirable flat surface. For example, with reference to FIG. 2, a thin film circuit 200 comprises a plurality of thin film resistors (TFR's) 202 layered on top of a substrate 204. Because the thickness of the dielectric utilized can vary, thin film circuit 200 includes a plurality of metal "dummy fill" 206 to minimize the variances in the thickness of the dielectric layers. Dummy fill 206 comprise metal strips having different widths generally between approximately 2 $\mu$m and 3 $\mu$m, and having crowned dielectric peaks that are a function of the given width of each dummy fill 206. Some of dummy fill 206 are configured with dielectric peaks that are raised upwards, i.e., towards thin film resistors 202, while others are significantly smaller in order to provide as homogeneous a substrate as possible for depositing of thin film resistors 202.

While current techniques for providing a dummy fill can improve the uniformity of the dielectrics, the substrate and dielectrics beneath the thin film resistor are still not as homogeneous as desired. For example, upon depositing of various metal layers, such as tungsten plugs, and then oxides comprising high-density plasma depositions (HDP's), dielectric peaks are produced that have a height based on the width of the dummy fill. For example, with reference to FIG. 3, three fill metal strips 302, 304 and 306 having different widths are spaced apart and configured underneath a deposit of high-density plasma 308. After applying another silicon oxide film 310, such as TEOS, chemical-mechanical polishing is applied in attempt to provide a flat surface. Unfortunately, features, known as "tee-pees" can be formed between the high-density plasma and the plasma-enhanced TEOS layers that cause bumps in the substrate of approximately 7000 Å before chemical-mechanical polishing, and 30 Å to 50 Å or more after chemical-mechanical polishing. While these bumps or "tee-pees" are relatively small compared to the substrate, the bumps are quite large relative to the thin-film resistor that can comprise 30 Å to 35 Å in thickness, and thus cause difficulty during the trimming process and/or induce resistor instability. Accordingly, prior art methods and devices for control of dielectric layers below the thin film resistors are insufficient for optimizing the laser trimming process.

SUMMARY OF THE INVENTION

In accordance with various aspects of the present invention, a method and structure for controlling the surface properties in the dielectric layers in a thin film component can be provided for improving the trimming process of a thin film element within a circuit. In accordance with an exemplary embodiment, an exemplary structure comprises a dummy fill comprising a more uniform fill pattern beneath an array of thin film elements to improve the control of the surface topology and/or properties of the dielectric layers below the thin film elements, such as thin film resistors. The exemplary fill pattern can comprise a plurality of smaller features or peaks providing a finer fill pattern that improves the control of the surface topology and/or properties of the dielectric layers for depositing a thin film element.

In accordance with an exemplary embodiment, an exemplary fill pattern can comprise a polysilicon or other like material strip configured above a substrate, a metal strip configured underneath the thin film resistor, or both a polysilicon strip and a metal strip, for example, the metal strip configured above and adjacent to the polysilicon strip. The fill pattern can be configured in various manners, such as fill patterns parallel to the thin film resistor, fill patterns perpendicular to the thin film resistor, or fill patterns comprising a checkerboard-like configuration.

In accordance with another aspect of the present invention, the method and structure for controlling the surface topology and/or properties of the dielectric layers can provide for a reduction in the destructive interferences that can be caused by reflecting back of the incident energy. In accordance with an exemplary embodiment, the fill pattern comprises a dispersion arrangement, such as a matrix, configured to provide dispersive grading of the laser energy below the thin film element and thus reduce the collimation and availability of reflected energy of the incident laser beam.

In accordance with another aspect of the present invention, the method and structure for controlling the dielectric layers can provide for improved acquisition of the laser alignment targets.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and steps. Such functional components and steps may be realized by any number of hardware or structural components configured to perform the specified functions. For example, the present invention may employ various types of dielectrics, polysilicon and metal compositions whose characteristics may be suitably configured for modifying various electrical properties of a circuit. In addition, the present invention may be practiced in any integrated circuit application or discrete resistor application. However for purposes of illustration only, exemplary embodiments of the present invention are described in connection with trimming resistance values within thin film elements.

In accordance with various aspects of the present invention, a method and structure for controlling the surface topology and/or properties of the dielectric layers in a thin film component can be provided for improving the trimming process of a thin film element. A thin film element can comprise various devices and components. In accordance with an exemplary embodiment, the thin film element comprises a thin film resistor configured in an amplifier circuit.

Figure 1:
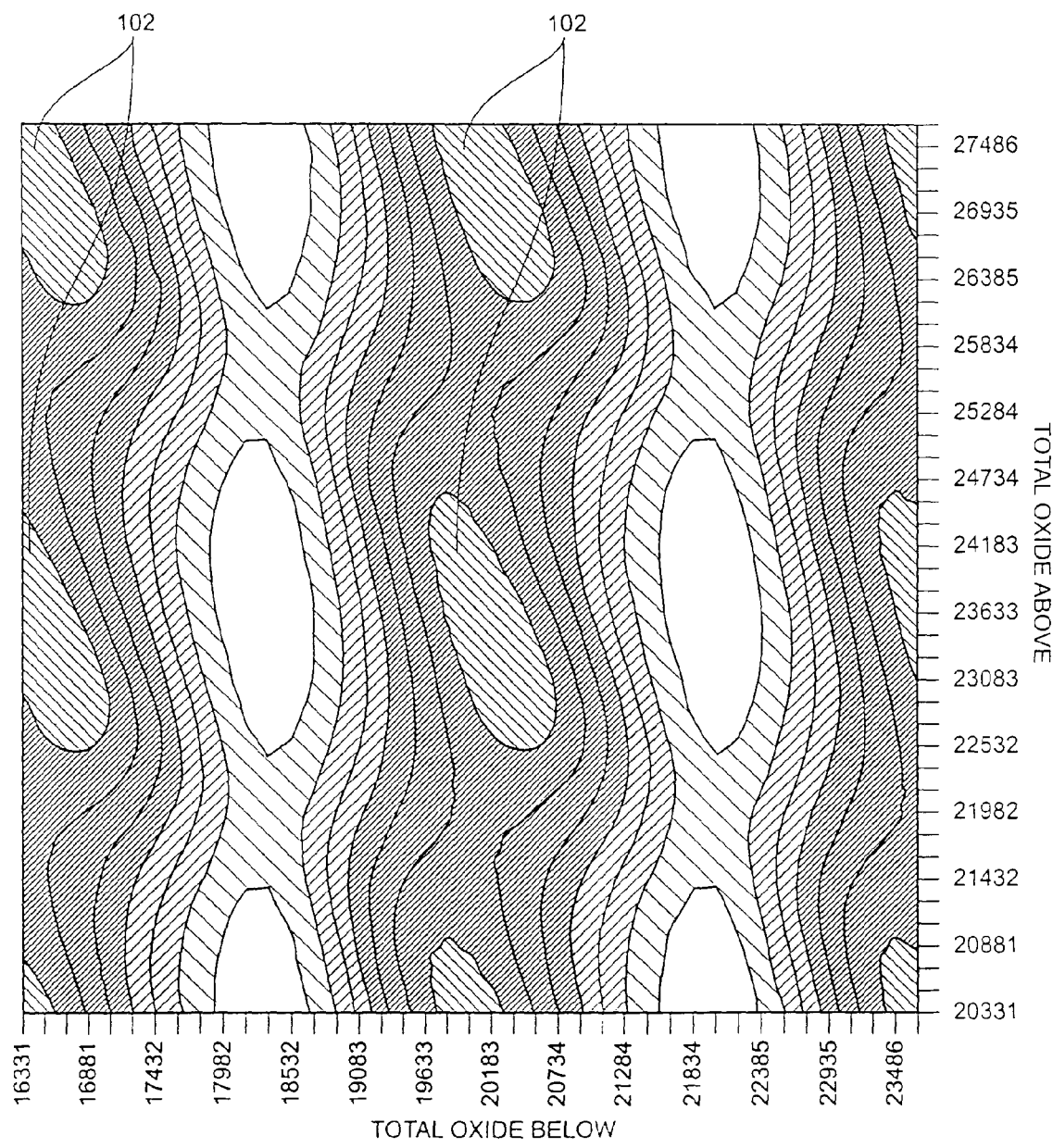
FIG. 1 illustrates a diagram of a simulation of the trimming region for a thin film resistor having oxide layers above and below the thin film resistor.
Figure 2:
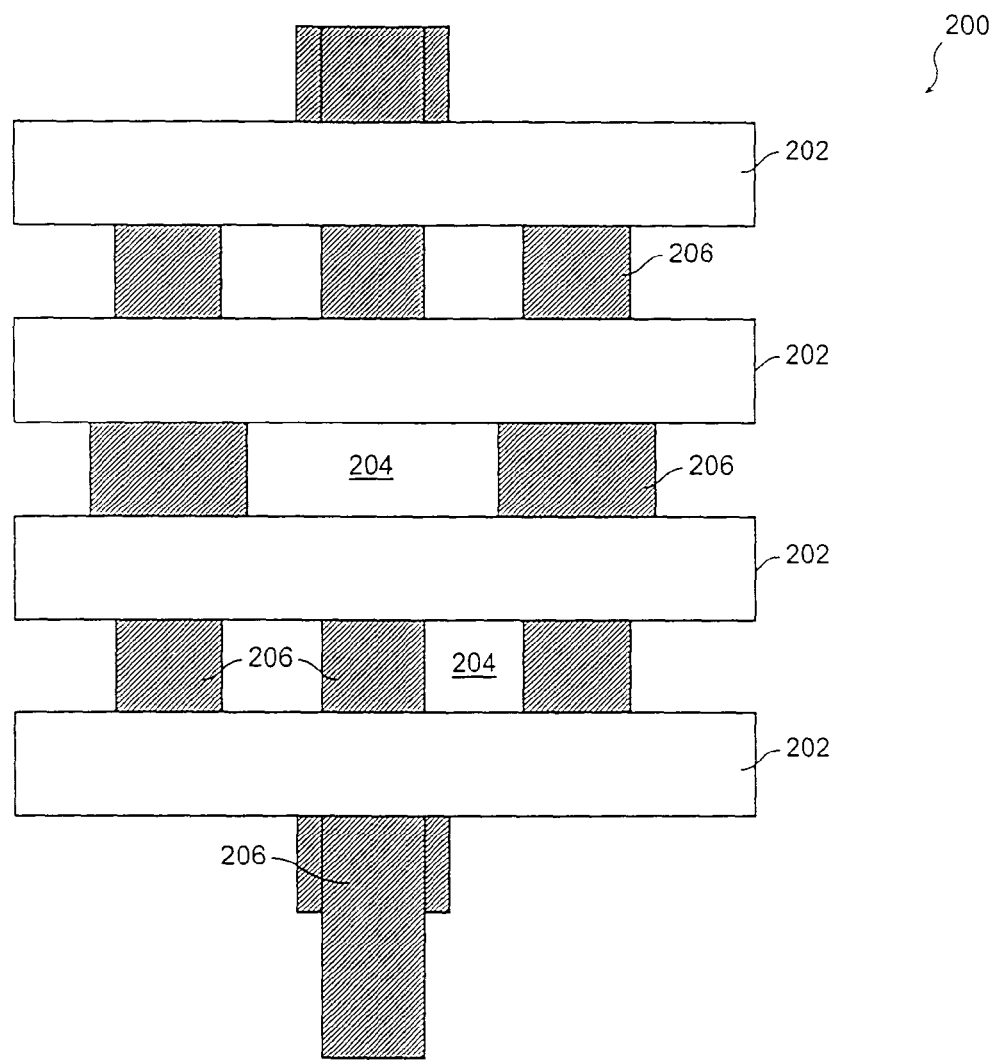
FIG. 2 illustrates a prior art dummy fill metal pattern for a thin film resistor.
Figure 3:
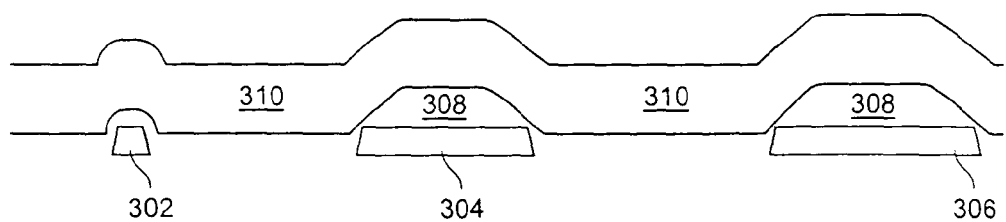
FIG. 3 illustrates a prior art dummy fill pattern having a high density plasma deposition.
Figure 4:
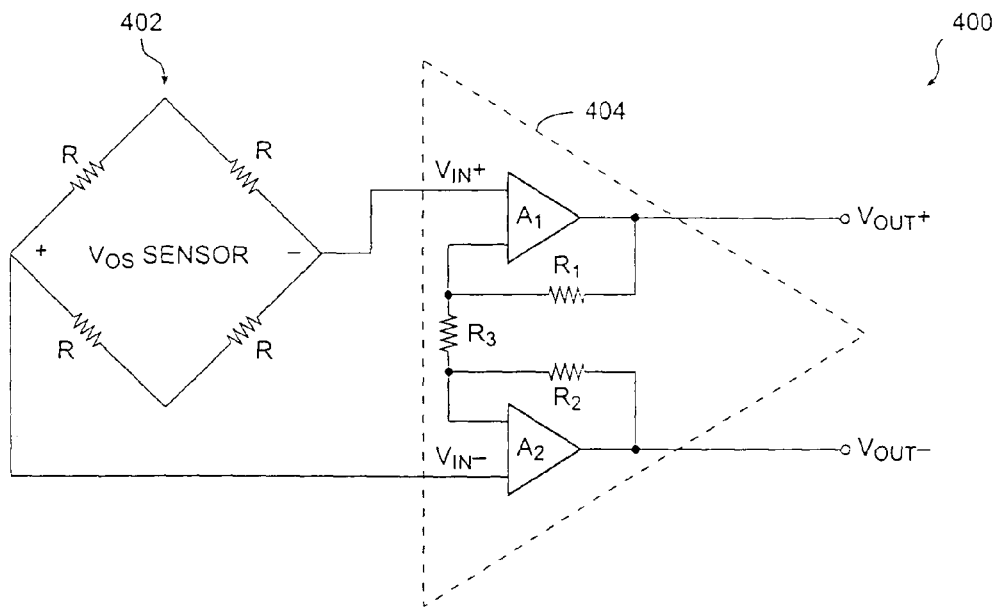
FIG. 4 illustrates an exemplary circuit for which an exemplary thin film component can be implemented in accordance with an exemplary embodiment of the present invention.

For example, with reference to FIG. 4, an amplifier circuit 400 comprises a sensor 402 and an instrumentation amplifier 404. Sensor 402 is represented by a bridge circuit comprising four resistors R, and can comprise any sensor circuit providing a sensed voltage to instrumentation amplifier 404. Instrumentation amplifier 404 comprises a pair of op amps $A_1$ and $A_2$ configured in a differential input/differential output configuration, i.e., with input terminals $V_{IN}^+$ and VIN and output terminals $V_{OUT}^+$ and $V_{OUT}^-$, and can also comprise various other instrumentation amplifier configurations. Instrumentation amplifier 404 further comprises resistors $R_1$, $R_2$ and $R_3$ configured in a gain arrangement. Any or all of resistors R, and resistors $R_1$, $R_2$ and $R_3$ can be configured from an exemplary thin film resistor of the present invention. Moreover, an exemplary thin film resistor can be configured in any operational amplifier and any instrumentation amplifier configuration, as well as any other configurations, such as voltage regulators, references and A/D and D/A converters, or any other amplifier arrangement for high-precision data acquisition and instrumentation applications or wherever else thin film resistor components are implemented.

In accordance with an exemplary embodiment, an exemplary structure within a thin film component comprises a "dummy fill" comprising a more uniform fill pattern beneath a plurality of thin film elements, e.g., comprising an array of thin film resistors, to improve the control of the surface topology and/or properties of the dielectric layers below the thin film elements. The thin film elements can comprise various thin film-types of devices and structures, including resistors, fuses and the like, and can comprise poly, metal or other like materials.

In accordance with various exemplary embodiments, an exemplary fill pattern can comprise a polysilicon or other like material strip configured above a substrate, a metal strip configured underneath the thin film element, or both a polysilicon strip and a metal strip, for example, the metal strip configured above and substantially adjacent to the polysilicon strip. The polysilicon strip and the metal strip can comprise a plurality of smaller features or peaks providing a finer fill pattern that improves the control of the dielectric layers. For example, while conventional dummy fill metal layers can comprise widths between approximately 1 $\mu$m and 3 $\mu$m, in accordance with an exemplary embodiment of the present invention, an exemplary fill pattern can comprise a strip width between approximately 0.3 $\mu$m and 0.8 $\mu$m, such as a 0.5 $\mu$m width. As a result, not only are the dielectric peaks generated by the exemplary dummy fill pattern lower in height than conventional peaks, but also a greater number of peaks can be configured within the surface of the dielectrics beneath the thin film element. As a result, a more uniform surface topology for the dielectrics beneath the thin film circuit can be obtained. Accordingly, rather than attempting to optimize the material properties of the dielectric layers above and below the thin film element, the surface of the dielectric layers below the thin film element can be made more uniform through use of an appropriate fill pattern.

Thus, in accordance with an exemplary embodiment of the present invention, a method for controlling the surface topology of dielectric layers in a thin film component to improve the trimming process comprises the steps of providing a substrate material, creating a fill pattern comprising a plurality of uniform features above the substrate material, and depositing a thin film element above the fill pattern, wherein the fill pattern provides a uniform surface dielectric layer for depositing the thin film element. In addition, the step of depositing the fill pattern can comprise depositing at least one of a plurality of polysilicon strips above the substrate material and a plurality of metal strips underneath the thin film element.

Figure 5:
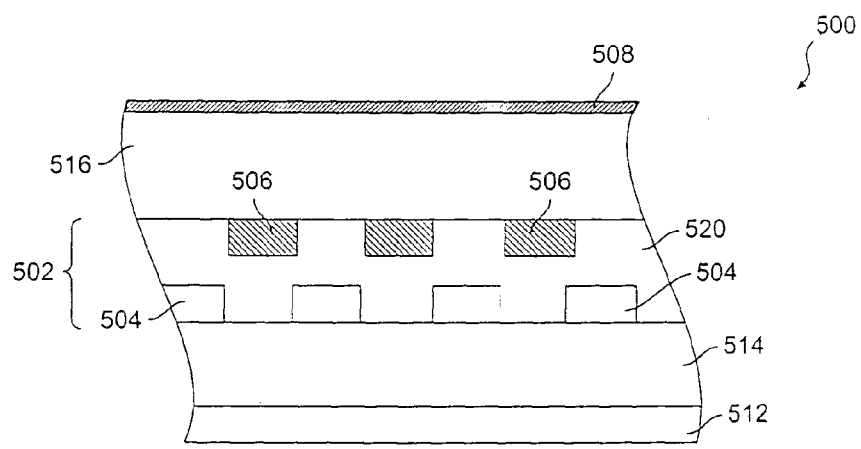
FIG. 5 illustrates a side view of an exemplary thin film component in accordance with an exemplary embodiment of the present invention.

An exemplary fill pattern can be configured in various manners within an exemplary thin film component depending on the substrate and other dielectrics beneath the thin film element. In accordance with an exemplary embodiment, with reference to FIG. 5, an exemplary thin film component 500 comprises a substrate 512, a fill pattern 502, and a thin film element 508. Substrate 512 can comprise various types of substrate materials, such as silicon, as well as various other conducting/insulating and/or semiconductor layers. Thin film resistor 508 comprises any thin film resistor configuration, and can be comprised of SiCr, NiCr and/or TaN, among other known materials for thin film resistors. Thin film resistor 508 could also comprise a fuse or other thin film element. Thin film circuit 500 can also be configured with various other dielectric and/or insulating layers between thin film resistor 508 and substrate 512, such as dielectric materials 514, 516 and 520.

In the exemplary embodiment, fill pattern 502 comprises a plurality of polysilicon strips 504 configured above substrate 512, and a plurality of metal strips 506 configured above polysilicon strips 504 and beneath thin film resistor 508. The plurality of metal strips 506 can also be configured substantially adjacent to plurality of polysilicon strips 504, e.g., plurality of metal strips 506 can be configured such that the respective edges of each polysilicon strip 504 and each metal strip 506 are aligned in the same vertical plane, have a slight opening, and/or have a slight overlap. Further, the plurality of metal strips 506 can also be configured in a stacked arrangement with plurality of polysilicon strips 504.

Although both a plurality of polysilicon strips 504 and a plurality of metal strips 506 are illustrated in the exemplary embodiment, fill pattern 502 could also be configured with only plurality of polysilicon strips 504 or plurality of metal strips 506. For example, in non-CMP applications, fill pattern 502 could comprise only plurality of polysilicon strips 504 to improve the control of the contrast between the thin film and dielectric layers to improve the trimming process. Further, fill pattern 502 could comprise only plurality of metal strips 506 to improve the resistor stability, i.e., dielectric uniformity, and thus improve the trimming process. In addition, fill pattern 502 can be configured with any number of polysilicon strips 504 and/or metal strips 506, such as the same number of polysilicon strips 504 as metal strips 506, or more or less polysilicon strips 504.

An exemplary fill pattern 502 can also be configured in various manners beneath a thin film network. For example, with reference to an exemplary embodiment illustrated in FIG. 6, a thin film component 600 comprising a parallel arrangement of thin film resistors 608 can be configured with a fill pattern 602 comprising both a plurality of polysilicon strips 604 and a plurality of metal strips 606 configured substantially parallel to thin film resistors 608. In accordance with this exemplary embodiment, fill pattern 602 is configured in a parallel arrangement relative to thin film resistors 608 to address surface protuberant defects that can occur within the dielectric layers. Polysilicon strips 604 are configured in parallel above a substrate, such as silicon, with metal strips 606 being configured in parallel above polysilicon strips 604. In addition, polysilicon strips 604 and metal strips 606 are configured substantially adjacent to each other such that any focused energy directed towards thin film resistor 608 and fill pattern 602 will also impact strips 604 and metal strips 606.

In accordance with various exemplary embodiments, the width of polysilicon strips 604 and metal strips 606 can vary, for example, between approximately 0.3 μm and 0.8 μm, or other desired widths. In accordance with the exemplary embodiment of FIG. 6, polysilicon strips 604 and metal strips 606 comprise approximately 0.5 μm in width, significantly less than conventional dummy fill layers. As a result, each polysilicon strip 604 and substantially adjacent metal strips 606 provides a pitch of approximately 1.0 μm. Accordingly, fill pattern 602 can comprise a greater plurality of features having a more uniform configuration to provide a more controllable dielectric surface.

Figure 7:
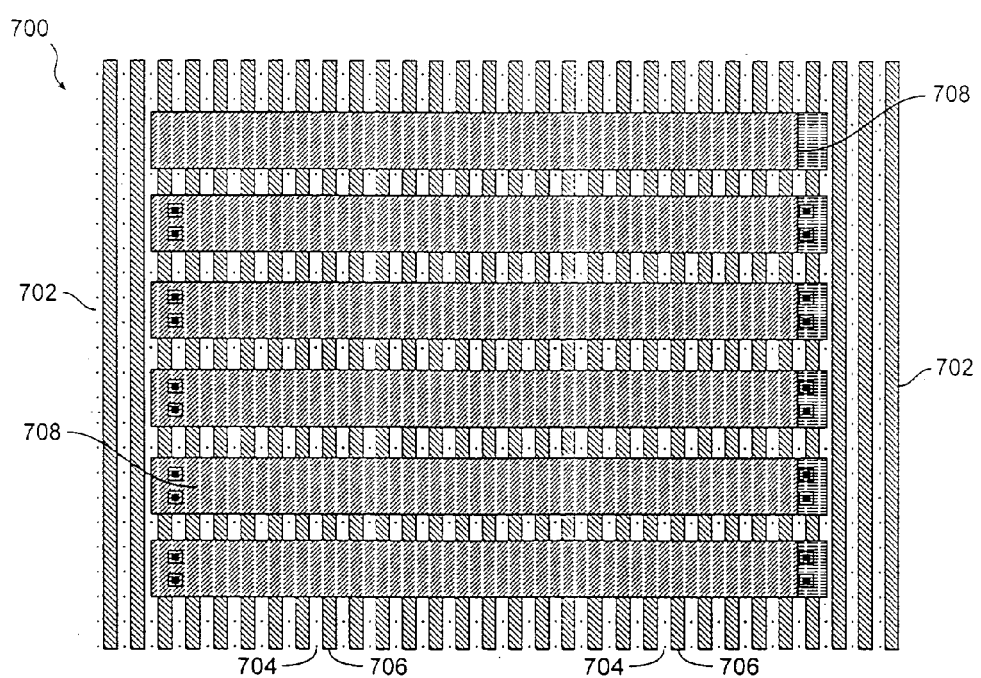
FIG. 7 illustrates an exemplary perpendicular fill pattern configured underneath a thin film element in accordance with another exemplary embodiment of the present invention.

In accordance with another exemplary embodiment, with reference to FIG. 7, a thin film component 700 comprising a plurality of parallel strips of thin film resistors 708 can also be configured with a fill pattern 702 comprising both a plurality of polysilicon strips 704 and a plurality of metal strips 706 configured substantially perpendicular to the strips of thin film resistors 708. In accordance with this exemplary embodiment, fill pattern 702 is configured in a perpendicular arrangement relative to thin film resistors 708 to address surface wave or elongation defects in the substrate and dielectric layers. Polysilicon strips 704 are configured in parallel above a substrate, such as silicon, and perpendicular relative to thin film resistors 708, with metal strips 706 being configured above and in parallel with polysilicon strips 704. Polysilicon strips 704 and metal strips 706 are configured substantially adjacent to each other such that any focused energy directed towards thin film resistor 708 and fill pattern 702 can also impact strips 704 and metal strips 706. Like that of fill pattern 602, the width of strips 704 and layers 706 can vary between approximately 0.3 μm and 0.8 μm, e.g., approximately 0.5 μm in width in this exemplary embodiment. As a result, each strip 704 and adjacent layer 706 provides a pitch of approximately 1.0 μm. Accordingly, fill pattern 702 can comprise a greater plurality of features having a more uniform configuration to provide a more controllable dielectric surface for depositing the thin film resistor.

Figure 8:
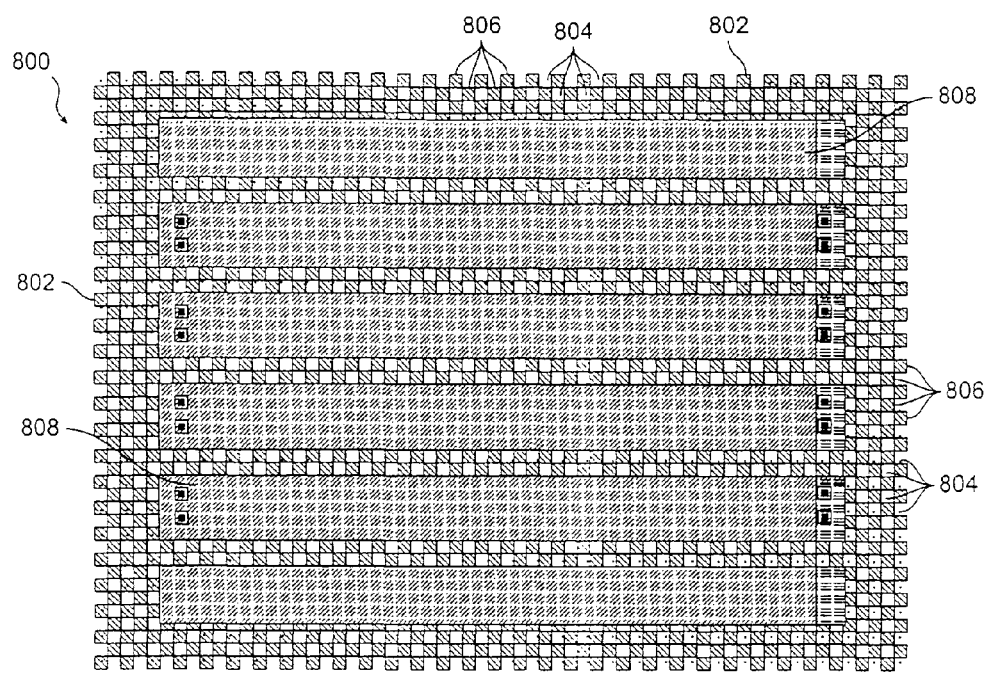
FIG. 8 illustrates an exemplary checkerboard-like fill pattern configured underneath a thin film element in accordance with another exemplary embodiment of the present invention.

In accordance with another exemplary embodiment, with reference to FIG. 8, a thin film component 800 can comprise a fill pattern 802 configured in a checkerboard-like pattern. In accordance with this exemplary embodiment, fill pattern 802 comprises polysilicon strips 804 and metal strips 806 configured to provide a checkerboard-like pattern, i.e., polysilicon strips 804 and metal strips 806 both comprise matrices having square-like features configured to provide a more uniform dielectric layer underneath thin film resistor 808. Polysilicon strips 804 are configured in a matrix arrangement above a substrate, such as silicon, with metal strips 806 being configured above and adjacent to polysilicon strips 704. Similar to that of fill patterns 602 and 702, the width of polysilicon strips 804 and metal strips 806 can vary between approximately 0.3 μm and 0.8 μm, e.g., approximately 0.5 μm in width in this exemplary embodiment, resulting in a pitch of approximately 1.0 μm. Further, the length of polysilicon strips 804 and metal strips 806 can also vary between approximately 0.3 μm and 0.8 μm, e.g., approximately 0.5 μm, and thus comprise a greater plurality of features, substantially uniform in nature.

While fill patterns 602, 702 and 802 include strips 604, 704 and 804 comprising a polysilicon material, other materials can be suitably implemented. Further, metal strips 606, 706 and 806 can also comprise various metal alloys. The configuration of metal strips 606, 706 and 806 comprise a significantly greater number of features, which are also more uniform in nature, than conventional dummy fill layers.

Figure 6:
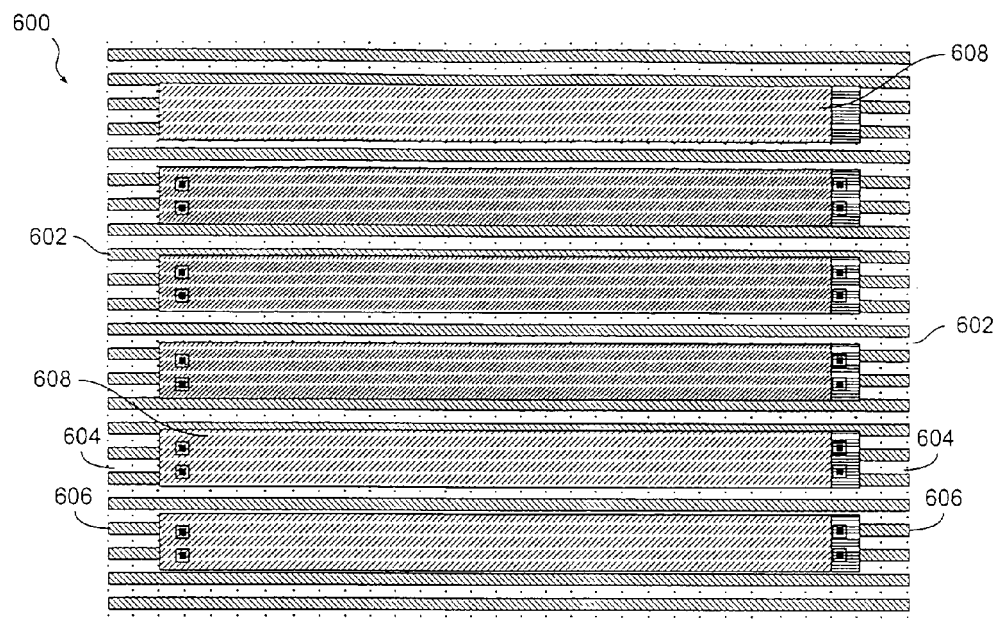
FIG. 6 illustrates an exemplary parallel fill pattern configured underneath a thin film element in accordance with an exemplary embodiment of the present invention.

Although both plurality of polysilicon strips 604, 704 and 804 and plurality of metal strips 606, 706 and 806 are illustrated in the exemplary embodiment of FIGS. 6, 7 and 8, fill patterns 602, 702 and 802 could also be configured with only plurality of polysilicon strips 604, 704 and 804 or plurality of metal strips 606, 706 and 806. In addition, while metal strips 606, 706 and 806 are generally configured above polysilicon strips 604, 704 and 804, various dielectric layers can be configured in between. Moreover, the configurations of fill patterns 602, 702 and 802 are not limited to the parallel, perpendicular or checkerboard-like arrangements above, and can be configured in any arrangement configured to provide a more uniform surface layer for depositing the thin film resistors. For example, an exemplary fill pattern can be configured with either polysilicon strips 604, 704 and 804 or metal strips 606, 706 and 806 configured in different arrangements, e.g., polysilicon strips 604, 704 and 804 can be configured in a parallel, perpendicular or checkerboard-like arrangement while metal strips 606, 706 and 806 can be configured in the same or a different arrangement. Accordingly, an exemplary fill pattern, including polysilicon strips and/or metal strips, can be configured in any manner for providing a more uniform surface of the dielectric layer for depositing the thin film resistor.

As a result of the configuration of fill patterns 602, 702 and 802, a uniform set of "teepees" results for depositing the thin film resistor, with the "teepees" comprising negligible bumps after chemical-mechanical polishing of an overlying oxide layer. Moreover, the control tolerances for trimming can be configured within +/−400 Å, and thus enable focusing of the laser energy towards the "sweet spot" of the thin film element. Accordingly, fill patterns 602, 702 and 802 can comprise a greater plurality of features configured to provide a more controllable dielectric surface, i.e., to provide a level of control not possible through conventional deposition and oxidation, and thus improve the trimming process of thin film elements.

In accordance with another aspect of the present invention, the method and structure for controlling the surface topology and/or properties of the dielectric layers can provide for a reduction in the destructive interferences that can be caused by reflection of the incident beam. In accordance with an exemplary embodiment, the fill metal pattern comprises a dispersion arrangement configured to provide dispersive grading of the laser energy below the thin film resistor and thus reduce the interaction of reflected energy with the incident laser beam.

Figure 9:
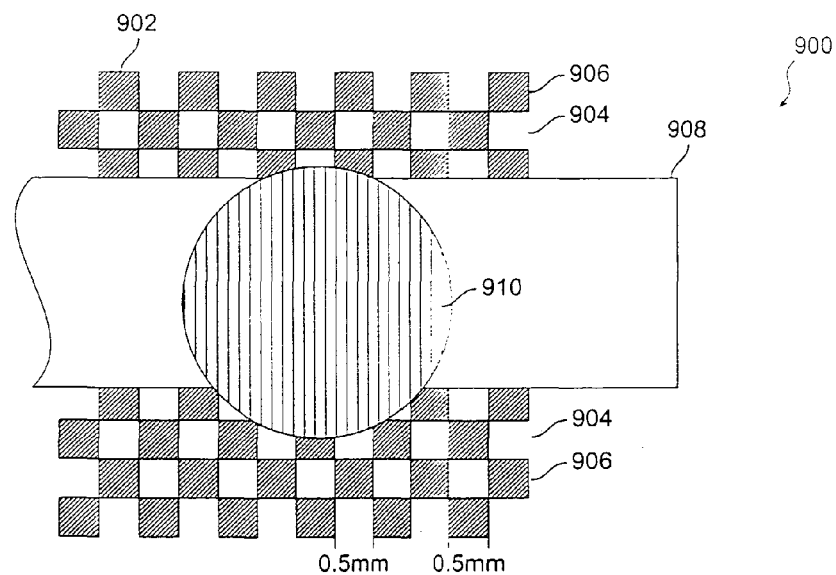
FIG. 9 illustrates a top view of an exemplary thin film component including an exemplary fill pattern for dispersing laser energy in accordance with an exemplary embodiment of the present invention.

For example, with reference to FIG. 9, an exemplary thin film component 900 comprises a fill pattern 902 configured beneath a thin film resistor 908. In accordance with the exemplary embodiment, fill pattern 902 comprises a dispersion matrix configuration including both polysilicon strips 904 and metal strips 906 configured in a checkerboard-like pattern. As a laser energy is focused towards thin film resistor 908 to provide a laser focused region 910, some energy will be absorbed by thin film resistor 908 to provide trimming of the impedance. The remaining energy will be transmitted past thin film resistor 908 towards fill pattern 902. However, fill pattern 902, including polysilicon layers 904 and metal strips 906, is configured to provide dispersion of the laser energy below thin film resistor 908 and thus reduce and/or eliminate the interference of reflected energy with the incident laser beam.

Figure 10:
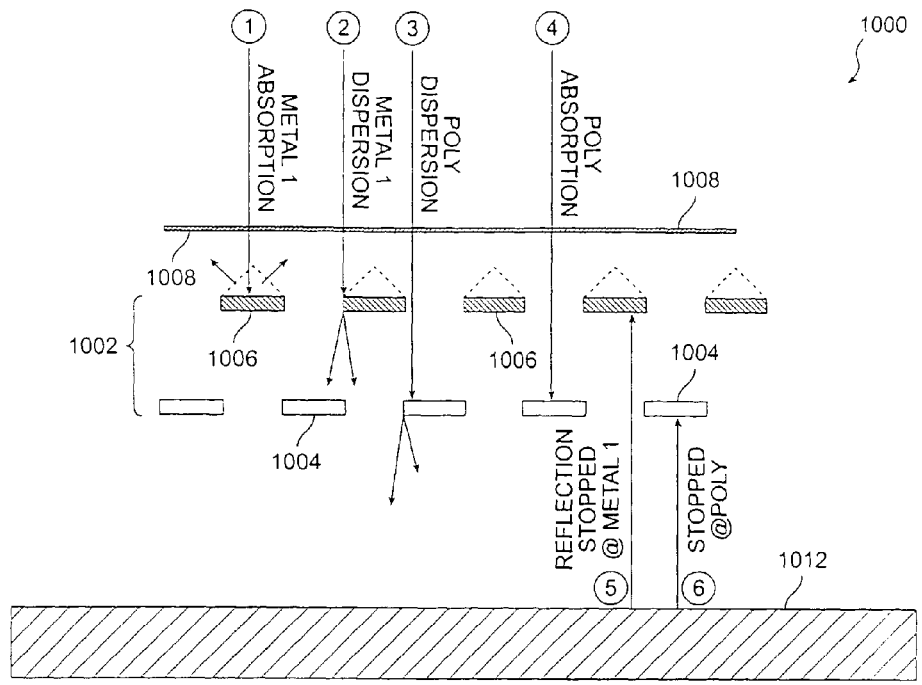
FIG. 10 illustrates block diagram of an exemplary thin film component including an exemplary fill pattern for dispersing laser energy in accordance with an exemplary embodiment of the present invention.

For example, with reference to FIG. 10, an exemplary thin film component 1000 comprises a fill pattern 1002 deposited on a silicon substrate 1012, and configured underneath a thin film resistor 1008. Fill pattern 1002, comprising a plurality of polysilicon strips 1004 and metal strips 1006, is configured in a dispersion matrix with polysilicon strips 1004 and metal strips 1006 spaced substantially adjacent to each other such that laser energy is readily absorbed or otherwise dispersed by fill pattern 1002 to prevent interference of reflected energy with the incident laser beam.

As laser energy is focused on thin film resistor 1008, some energy will be absorbed by thin film resistor 1008, while the remaining energy will be transmitted through to fill pattern 1002 and either suitably dispersed or absorbed. For example, a first ray of energy (1) directed towards a metal strip 1006 is suitably absorbed by metal strip 1006. In accordance with the exemplary embodiment, to further improve the absorption process, metal strip 1006 comprises an anti-reflective coating, such as TiN and the like. A second ray of energy (2) directed towards the edge of a metal strip 1006 can be suitably dispersed towards a polysilicon strip 1004 and substrate 1012. Thus, as second ray of energy (2) reaches the edge of metal strip 1006, second ray of energy (2) can be diffracted to a polysilicon strip 1004 for absorption or is further dispersed and/or diffracted towards substrate 1012. In any event, dispersed ray (2) of energy is no longer collimated with the incident beam of energy.

A third ray of energy (3) and a fourth ray of energy (4) may be directed past adjacent metal strips 1006. In the event that third ray of energy (3) is directed towards an edge of a polysilicon strip 1004, third ray of energy (3) can be suitably diffracted towards silicon 1012, i.e., angled away from the edge of polysilicon strip 1004, such than any reflected energy from substrate 1012 is no longer in collimation with the incident beam. If a fourth ray of energy (4) is directed towards polysilicon strip 1004, fourth ray of energy (4) can be suitably absorbed by polysilicon strip 1004. Further, to the extent that any portion of second ray of energy (2) or third ray of energy (3) are diffracted or otherwise directed towards substrate 1012, any reflected energy (5) and (6) can be suitably absorbed upon impacting the bottom of a metal strip 1006 and/or polysilicon strip 1004. It should be noted that rays of energy (1), (2), (3) and (4) are merely for illustrative purposes, and that fewer or greater numbers of rays of energy may be suitably received by fill pattern 1002.

Thus, with respect to rays of energy (1), (2), (3) and (4) that are not absorbed by thin film resistor 1008 and are directed towards fill pattern 1002 and substrate 1012, fill pattern 1002 can suitably absorb and/or diffract or otherwise disperse rays of energy (1), (2), (3) and (4) to prevent collimation of any reflected energy, and thus eliminate and/or reduce destructive interferences. In the event that any portions of rays of energy (1), (2), (3) and (4) are reflected back from fill pattern 1002, i.e., portions not absorbed or otherwise dispersed by polysilicon strips 1004 and metal strips 1006, any such portions will be minimal, or at least small in comparison to the amount of rays of energy (1), (2), (3) and (4) that are absorbed or otherwise dispersed, and significantly smaller when compared to the rays of energy that are absorbed by the thin film resistor during the trimming process.

Accordingly, a method for controlling the trimming process in a thin film element to prevent destructive interferences can comprise the steps of providing a substrate material used in integrated manufacturing, creating at least one of a polysilicon material and a metal strip above the substrate layer, creating a thin film circuit above said at least one of the polysilicon material and said metal strip, absorbing rays of energy from an incident beam in at least one of said polysilicon material and the metal strip, and dispersing rays of energy from the incident beam provided to edges of the at least one of the polysilicon material and the metal strip to prevent any reflected rays from the rays of energy from interacting with the incident beam.

Figure 11:
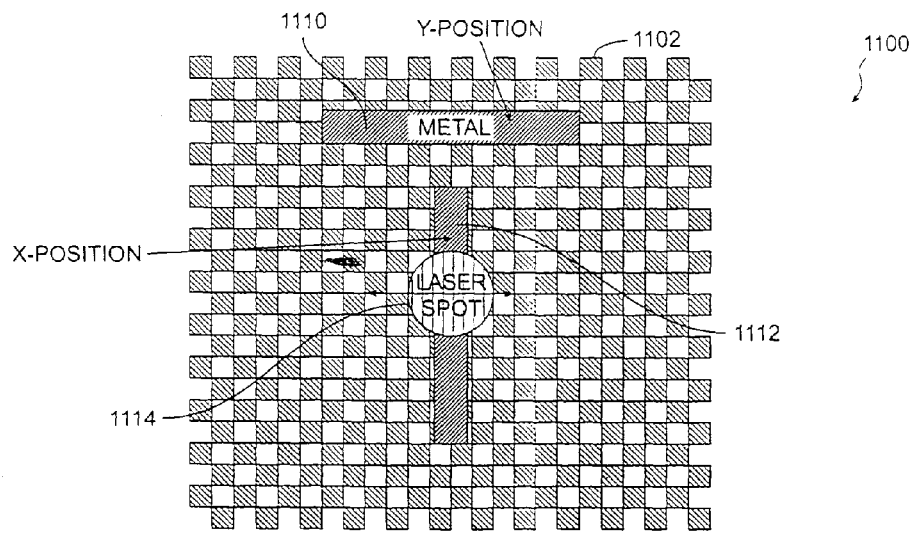
FIG. 11 illustrates a top view of an exemplary thin film component in accordance with an exemplary embodiment of the present invention.

In accordance with another aspect of the present invention, the method and device for controlling the surface topology and/or properties of the dielectric layers can provide for improved acquisition of the laser alignment targets. For example, with reference to an exemplary thin film component 1100 illustrated in FIG. 11, during the trimming process, a laser alignment target comprising a positioning mask, for example, a X-position component 1112 and a Y-position component 1110, is suitably identified to enable the laser energy to be reflected towards the incident optics. During identification, a laser energy spot 1114 scans back and forth across either of X-position component 1112 and Y-position component 1110 to acquire the position of the laser alignment target. For laser trim targets such as X-position component 1112 and Y-position component 1110, the scanned laser energy will result in some of the energy being directed towards dummy fill pattern 1102 which is then dispersed to prevent reflections from the substrate, thereby creating contrast between the laser trim target, i.e., X-position component 1112 and Y-position component 1110, and dummy fill pattern 1102. Without dispersive dummy fill pattern 1102, reflections from the substrate can result that make the laser target acquisition process very difficult. However, through implementation of dummy fill pattern 1102, any such reflections from the substrate should be substantially eliminated or reduced to suitably allow identification of X-position component 1112 and Y-position component 1110 for acquisition of the laser target, thus optimizing the trimming process.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, the dispersive matrix illustrated in the exemplary embodiments of FIGS. 9 and 10 can comprise only polysilicon strips 904, 1004 or metal strips 906, 1006. Further, the various exemplary embodiments can be implemented with other types of integrated circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A method for controlling the surface topology of dielectric layers in a thin film component to improve the trimming process, said method comprising the steps of:
   providing a substrate material;
   creating a fill pattern comprising a plurality of uniform features above and spaced from said substrate material; and
   depositing a thin film element above said fill pattern, wherein said fill pattern provides a substantially uniform surface dielectric layer for depositing said thin film element wherein said fill pattern comprises a plurality of metal strips beneath said thin film element.

2. The method according to claim 1, wherein said step of depositing said fill pattern comprises depositing at least one of a plurality of polysilicon strips above said substrate element and a plurality of metal strips underneath said thin film element.

3. The method according to claim 1, wherein said step of depositing said fill pattern comprises depositing a plurality of polysilicon strips above said substrate material and a plurality of metal strips above said plurality of polysilicon strips.

4. The method according to claim 3, wherein said polysilicon strips are configured substantially adjacent to said metal strips.

5. The method according to claim 3, wherein said step of depositing a thin film element comprises creating a plurality of thin film resistors, and wherein said step of creating said fill pattern comprises creating said plurality of polysilicon strips and said plurality of metal strips in a parallel arrangement relative to said thin film resistors.

6. The method according to claim 3, wherein said step of depositing a thin film element comprises creating a plurality of thin film resistors, and wherein said step of creating said fill pattern comprises depositing said plurality of polysilicon strips and said plurality of metal strips in a perpendicular arrangement relative to said thin film resistors.

7. The method according to claim 3, wherein said step of depositing a thin film element comprises creating a plurality of thin film resistors, and wherein said step of creating said fill pattern comprises creating said plurality of polysilicon strips and said plurality of metal strips in a checkerboard-like arrangement relative to said thin film resistors.

8. The method according to claim 3, wherein said step of created said fill pattern comprises depositing said plurality of polysilicon strips and said plurality of metal strips in a dispersive matrix such that any rays of energy provided from an incident beam during the trimming process are dispersed by at least one of said plurality of polysilicon strips and said plurality of metal strips to minimize destructive interferences with the incident beam.

9. A method for controlling the trimming process in a thin film device to prevent destructive interferences, said method comprising the steps of:
   providing a substrate material used in integrated manufacturing;
   creating at least one of a polysilicon material and a metal strip above and spaced from said substrate layer;
   creating a thin film circuit above said at least one of said polysilicon material and said metal strip wherein said polysilicon material and said metal strip being beneath said thin film circuit;
   absorbing rays of energy from an incident beam in at least one of said polysilicon material and said metal strip; and
   dispersing rays of energy from said incident beam provided to edges of said at least one of said polysilicon material and said metal strip to prevent any reflected rays from said rays of energy from interacting with said incident beam.

10. The method according to claim 9, wherein said method comprises the steps of depositing said polysilicon material above said substrate layer and depositing said metal strip above said polysilicon material.

11. The method according to claim 10, wherein said steps of depositing said polysilicon layer and depositing said metal strip comprise providing a plurality of uniform features to provide a uniform dielectric surface for depositing said thin film circuit.

* * * * *